(12) United States Patent
Luo et al.

(10) Patent No.: US 10,446,237 B1
(45) Date of Patent: Oct. 15, 2019

(54) TEMPERATURE SENSITIVE NAND PROGRAMMING

(71) Applicant: Micron Technology, Inc., Boise, ID (US)

(72) Inventors: Xiangang Luo, Fremont, CA (US); Jianmin Huang, San Carlos, CA (US); Jung Sheng Hoei, Newark, CA (US); Harish Reddy Singidi, Fremont, CA (US); Ting Luo, Santa Clara, CA (US); Ankit Vashi, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/024,316

(22) Filed: Jun. 29, 2018

(51) Int. Cl.
*G11C 16/10* (2006.01)
*G11C 16/34* (2006.01)
*G11C 7/04* (2006.01)

(52) U.S. Cl.
CPC .............. *G11C 16/10* (2013.01); *G11C 7/04* (2013.01); *G11C 16/349* (2013.01); *G11C 16/3459* (2013.01)

(58) Field of Classification Search
CPC ................................ G11C 16/10; G11C 16/26
USPC ........................................ 365/185.17, 185.24
See application file for complete search history.

(56) References Cited

U.S. PATENT DOCUMENTS

| | | | | |
|---|---|---|---|---|
| 9,275,741 B1 * | 3/2016 | Liang | ..................... | G11C 16/10 |
| 9,355,738 B2 * | 5/2016 | Im | ....................... | G11C 16/349 |
| 9,530,512 B2 * | 12/2016 | Ray | ........................ | G11C 16/26 |
| 9,928,126 B1 * | 3/2018 | Shappir | ............... | G11C 11/5642 |
| 10,115,471 B1 * | 10/2018 | Yang | ...................... | G11C 16/30 |
| 10,153,430 B1 * | 12/2018 | Kannalanathan | ....... | H01L 45/08 |
| 2005/0278073 A1 * | 12/2005 | Roth | ..................... | A61M 5/142 |
| | | | | 700/282 |
| 2008/0158970 A1 * | 7/2008 | Sekar | ....................... | G11C 7/04 |
| | | | | 365/185.17 |
| 2008/0158975 A1 * | 7/2008 | Sekar | ....................... | G11C 7/04 |
| | | | | 365/185.18 |
| 2008/0158976 A1 * | 7/2008 | Sekar | .................. | G11C 11/5642 |
| | | | | 365/185.18 |
| 2008/0159007 A1 * | 7/2008 | Sekar | ................. | G11C 16/3418 |
| | | | | 365/185.27 |
| 2010/0008151 A1 * | 1/2010 | Hwang | ............... | G06F 11/1068 |
| | | | | 365/185.22 |
| 2010/0110815 A1 * | 5/2010 | Lee | ......................... | G11C 5/143 |
| | | | | 365/211 |
| 2011/0205823 A1 * | 8/2011 | Hemink | ................... | G11C 7/04 |
| | | | | 365/211 |
| 2013/0163342 A1 * | 6/2013 | Dutta | ...................... | G11C 16/26 |
| | | | | 365/185.21 |
| 2015/0279472 A1 * | 10/2015 | Jones | ..................... | G11C 16/24 |
| | | | | 365/185.19 |
| 2016/0118131 A1 * | 4/2016 | Dong | ................. | G11C 16/3427 |
| | | | | 365/185.02 |

(Continued)

*Primary Examiner* — Michael T Tran
(74) *Attorney, Agent, or Firm* — Schwegman Lundberg & Woessner, P.A.

(57) ABSTRACT

Devices and techniques temperature sensitive NAND programming are disclosed herein. A device controller can receive a command to write data to a component of the device. A temperature can be obtained in response to the command, and the temperature can be combined with a temperature compensation value to calculate a verification level. The command can then be executed in accordance with the verification level.

15 Claims, 8 Drawing Sheets

(56) References Cited

U.S. PATENT DOCUMENTS

| | | | | |
|---|---|---|---|---|
| 2018/0335813 A1* | 11/2018 | Zhang | ................... | G06F 1/206 |
| 2018/0350446 A1* | 12/2018 | K | ......................... | G11C 29/44 |
| 2019/0018713 A1* | 1/2019 | Foxworth | ............. | G06F 9/5094 |
| 2019/0065086 A1* | 2/2019 | Margetts | ............... | G06F 3/0625 |
| 2019/0123276 A1* | 4/2019 | Ratnann | ............. | H01L 45/1608 |

\* cited by examiner

TEMPERATURE SENSITIVE NAND PROGRAMMING

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) can extend adjacent a string of storage cells to form a channel for the storages cells of the string. In the example of a vertical string, the polysilicon structure can be in the form of a vertically extending pillar. In some examples the string can be "folded," and thus arranged relative to a U-shaped pillar. In other examples, multiple vertical structures can be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs can include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

Figure 8:
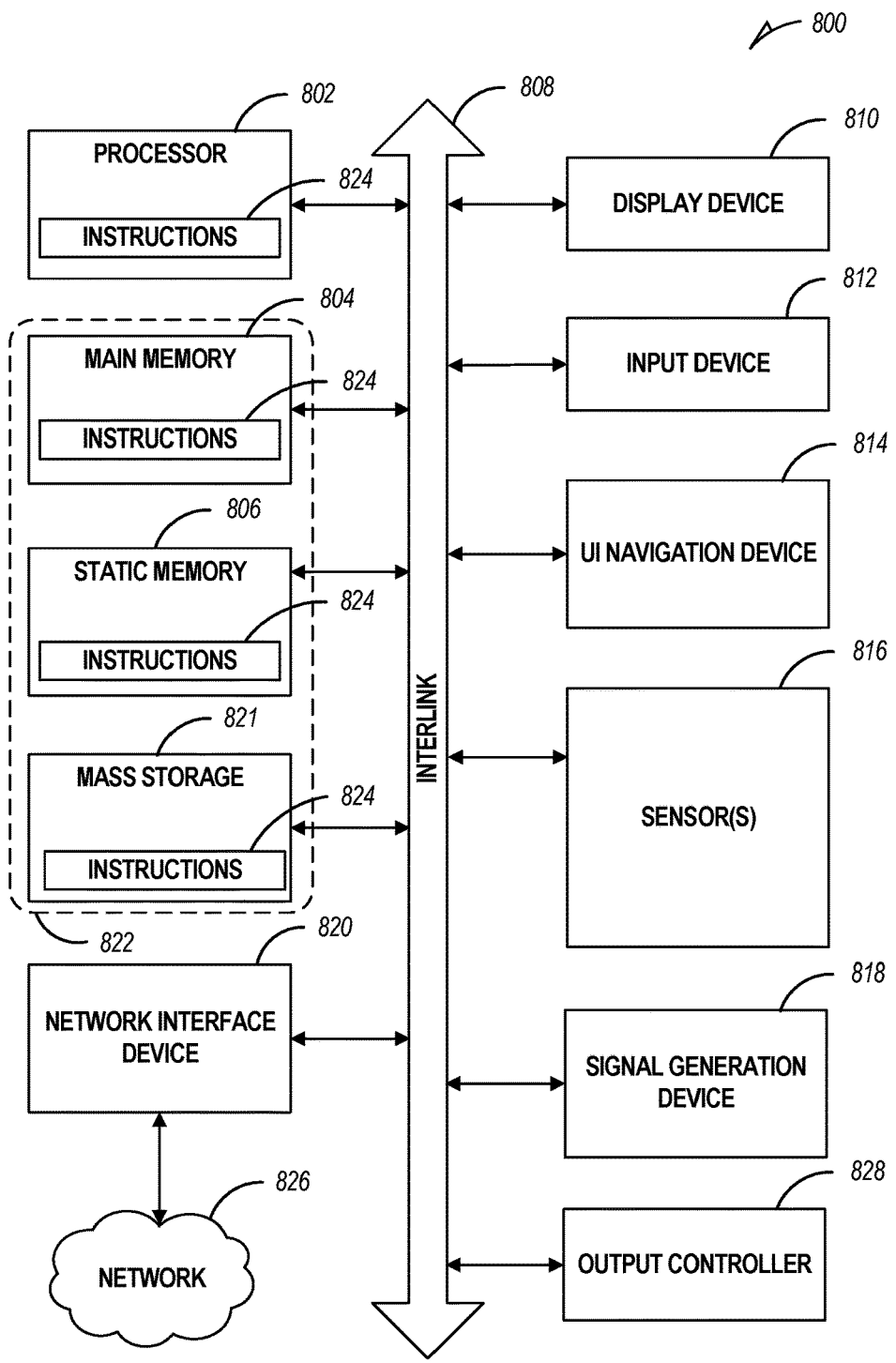
FIG. 8 is a block diagram illustrating an example of a machine upon which one or more embodiments can be implemented.

Flash devices operate by storing different charges on a device (e.g., floating gate). The stored charge interferes with a control gate to indicate a value stored in a cell. For example, in a single level cell, the read voltage of the control gate is calibrated to be between a charge for a '1' bit and a charge for a '0' bit; thus the read voltage is strong enough to overcome the '1' charge and not strong enough to overcome the '0' bit charge. For multi-level-cells (MLCs) of two bits or TLC of three bits, the floating gate charge can have many states (e.g., four and eight respectively) to represent two or three bits at each state. FIG. 8 illustrates an example of cell charge distributions for TLC encoding.

Charge accumulation and dissipation from the cells varies with temperature. Higher read errors due to different write and read temperature (e.g., a write at −40c and read at 108 C and vice versa) are related to the unequal Vt distribution shifts between the NAND cell voltage and the read voltages (e.g., which can be compensated internally by the device). This is known as a cross-temperature, where the charge on the cell crosses a read boundary due to the temperature. In some cases, the cross-temperature situation can result in voltage distribution widening due to non-uniform cross-temperature response of each cell in a page.

A wide operating temperature range can exist for many devices. For example, mobile devices (e.g., mobile phones, tablets, etc.) can have operating temperature ranges from −25° Celsius (C) to 85° C. Automobile applications can have an even greater operation range between −40° C. to 108° C. To address the wide temperature operating range, while mitigating cross-temperature effects, a temperature compensation procedure can be employed when programming a cell. The temperature compensation procedure can adjust programming passes or trims based on a current temperature to correct for the ambient temperature effects. Thus, for example, when hot, a lower trim can be employed, and smaller increments can be used to move the stored distribution to a target level. If the charge distributions are programmed to the target level without regard (e.g., to the extent possible) to the ambient temperature when writing, then the read compensation can be easier, and deal with a smaller range of ambient reading temperatures.

In addition to ambient temperature, the number of program-and-erase (P/E) cycles for a NAND cell can affect the charge distribution during programming. Generally, the greater the number of P/E cycles, the less voltage is used to achieve a given charge on the cell. Tracking the P/E cycles for the cell being programmed and using this value to modify the temperature compensation procedure can result in a more accurate starting and stepping voltage to achieve the target charge distribution. In an example, different NAND cells can also have different programming characteristics that can be accounted for in the temperature compensation procedure. In an example, these characteristics can be measured during manufacture and stored in the NAND device for use in the temperature compensation procedure.

Figure 1:
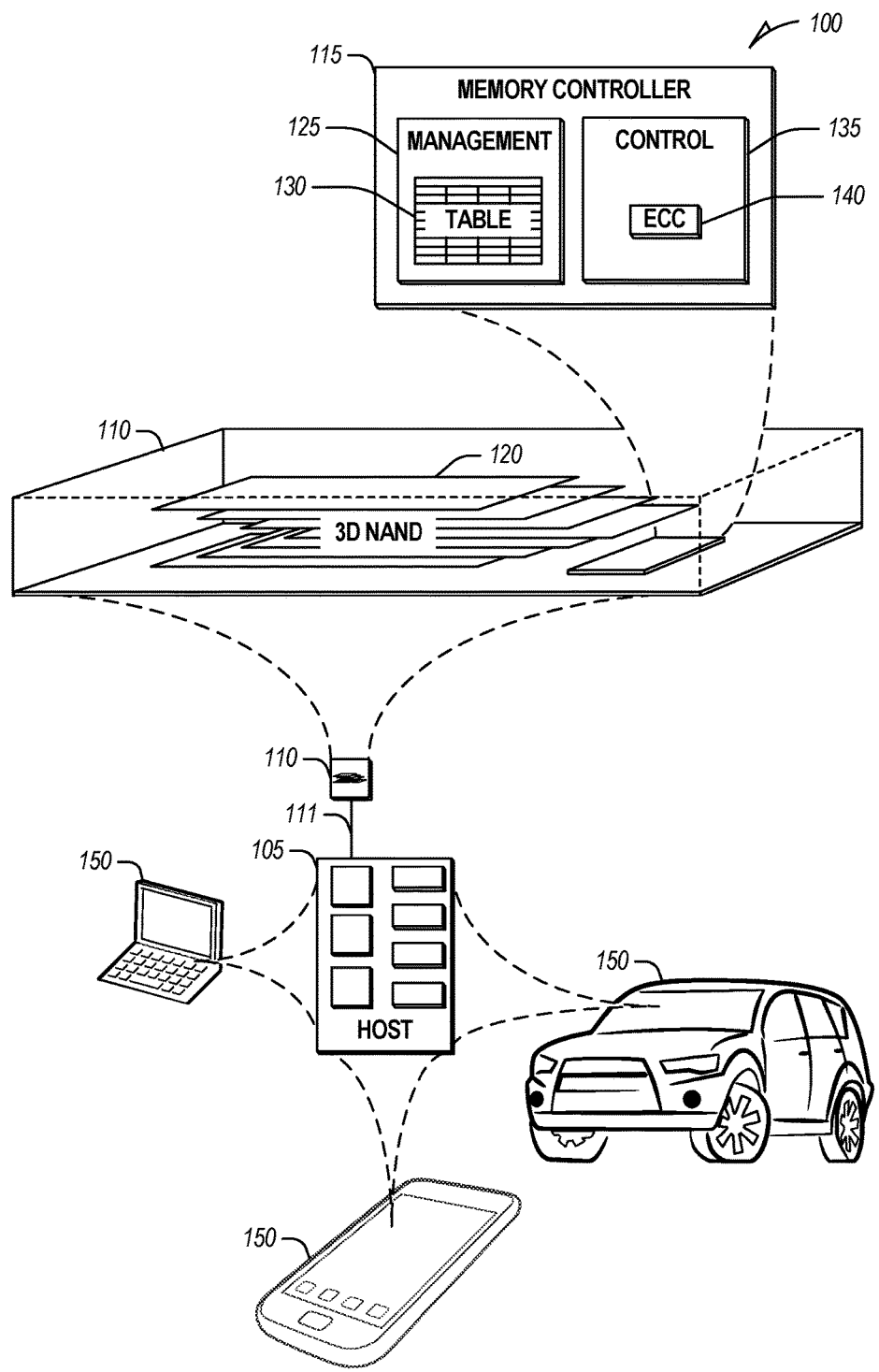
FIG. 1 illustrates an example of an environment including a memory device.

Thus, in an example, the temperature compensation procedure includes calculating the verification level by the temperature and the write temperature compensation value. The verification is checked after each program pulse to determine whether the target charge distribution has been achieved. The programming pulse can continue until the target charge distribution passes the verification level. An increase in the number of programming pulses can increase the program time (e.g., time to complete the programming), however it will generally result in a charge distribution that is easier read. In an example, the read levels (e.g., trims) are based on the write temperature the temperature compensation value can reduce errors in large cross-temperature situations. FIG. 1 illustrates an example of an environment 100 including a host device 105 and a memory device 110 configured to communicate over a communication interface. The host device 105 or the memory device 110 can be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105. In these examples, the memory device 110 communicates with host device 105 components via an interlink 111, such as a bus. Thus, as described herein, a host, or host device 105 operation is distinct from those of the memory device 110, even when the memory device 110 is integrated into the host device 105.

One or more communication interfaces (e.g., the interlink 111) can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 can be a machine having some portion, or all, of the components discussed in reference to the machine 800 of FIG. 8.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory can have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The array controller 135 can implement temperature sensitive NAND programming by incorporating NAND temperature readings, and individual device sensitivities (e.g., resulting from PIE cycles, manufacturing characteristics, etc.) during cell programming. Thus, the array controller 135 is arranged to receive an instruction to write data a NAND component in the array 120. The array controller 135 is arranged to obtain a temperature corresponding to the NAND component is obtained in response to receiving the command. In an example, temperature is retrieved from a thermometer in response to receiving the command. In an example, the temperature is received from a buffer. Here, the thermometer, or other entity, periodically measures the temperature and stores it in the buffer.

The array controller 135 is arranged to calculate a temperature compensation value from the temperature. In an example, temperature compensation value is specific to the NAND component. In an example, the NAND component is a page. Being specific to the NAND component addresses device variances that can occur in manufacture, for example. Thus, during manufacture, the NAND component can be tested to determine the sensitivities of its cells to different voltages during programming. This information can be stored in a one-time-programmable (OTP) area of the memory device 110 or the array 120, and referenced later (e.g., by the array controller 135). In this case, these sensitivities are used by the array controller 135 to adjust the temperature compensation value.

In an example, the array controller 135 is arranged to modify the temperature compensation value by a PIE cycle metric. This is useful because cell programming sensitivities to applied voltages tend to change due to the nature of NAND cell erasure. Thus, the more PIE cycles the cell has experienced, the more deviation from specification or manufacture testing the cell is likely to exhibit. In an example, the number of erasures is the PIE cycle metric. Generally, the erasure of a cell modifies its physical structure and causes the performance deviation from its design specification. Thus, the number of erasures serves as a good proxy to determine the impact of this process on the cell.

In an example, the array controller 135 is arranged to calculate the temperature compensation value by quantifying the temperature into one range of a set temperature ranges. Here, the array controller 135 selects the temperature compensation value using the one range. In an example, the set of temperature ranges do not overlap. In an example, the set of temperature ranges include the following ranges: <0° C., [0° C., 30° C.), [30° C., 90° C.), and ≥90° C.

In an example, the array controller 135 treats the temperature compensation value selected from the set of temperature ranges as an intermediate temperature compensation value and then modifies the intermediate temperature compensation value based on either the P/E metric or the NAND component specific metric (e.g., the programming voltage sensitivity determined during manufacture) to produce the temperature compensation value. The modification can take several forms, such as a weight or adjustment applied directly to the intermediate temperature compensation value, or as an additional key to the temperature to look up a final temperature compensation value in a data structure. However, the modification results in a temperature compensation value that is based on the temperature and the P/E cycle metric or the NAND component specific metric.

The array controller 135 is arranged to execute the command to write data to the NAND component in accordance with the temperature compensation value. This entails using the temperature compensation value as a validation during the cell programming. For example, for a given target charge distribution (e.g., see FIG. for example charge distributions and corresponding bit meanings in TLC encoding) the temperature compensation value is the pass value to meet the target charge distribution. The temperature compensation value is then read from the NAND trim table (e.g., a NAND component value of the temperature compensation value) and calculate verification level with the temperature to use to reach the target distribution. Thus, if the charge distribution hasn't reached the verification level after the first programming pulse, another programming pulse will occur until the charge distribution reaches the verification level.

In an example, the array controller 135 is arranged to program the cell by progressively setting the temperature compensation value, getting the temperature, and calculating the read level. In an example, the NAND component can compare the charge with the read level to get all array bits value for read.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC, QLC, etc.).

In operation, data is typically written to or read from the NAND memory device 110 in pages and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB can include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash device can have a higher bit error rate than a corresponding single-level cell (SLC) NAND flash device. As such, the MLC device can require more metadata bytes for error data than the corresponding SLC device.

Figure 2:
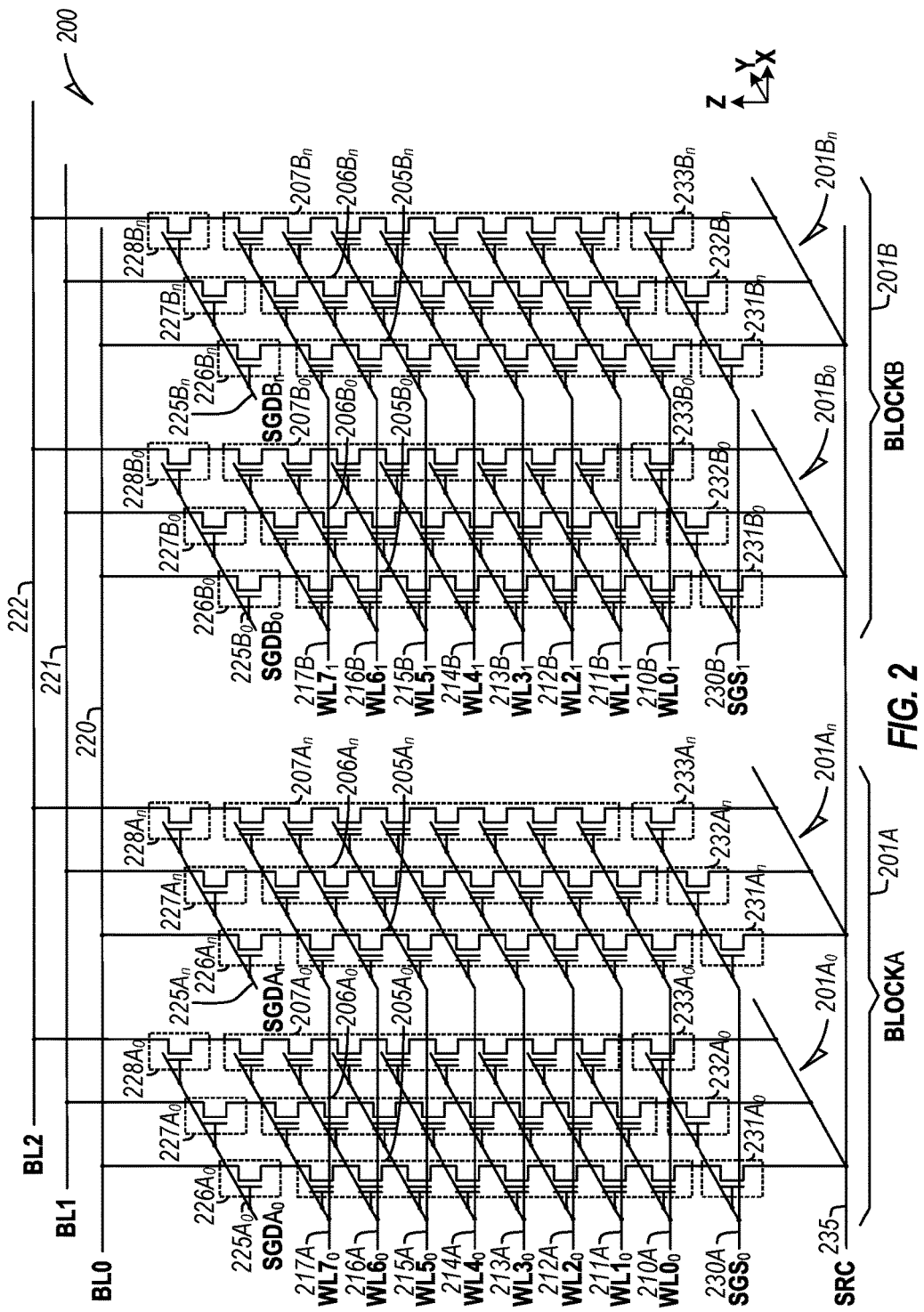
FIGS. 2-3 illustrate schematic diagrams of an example of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
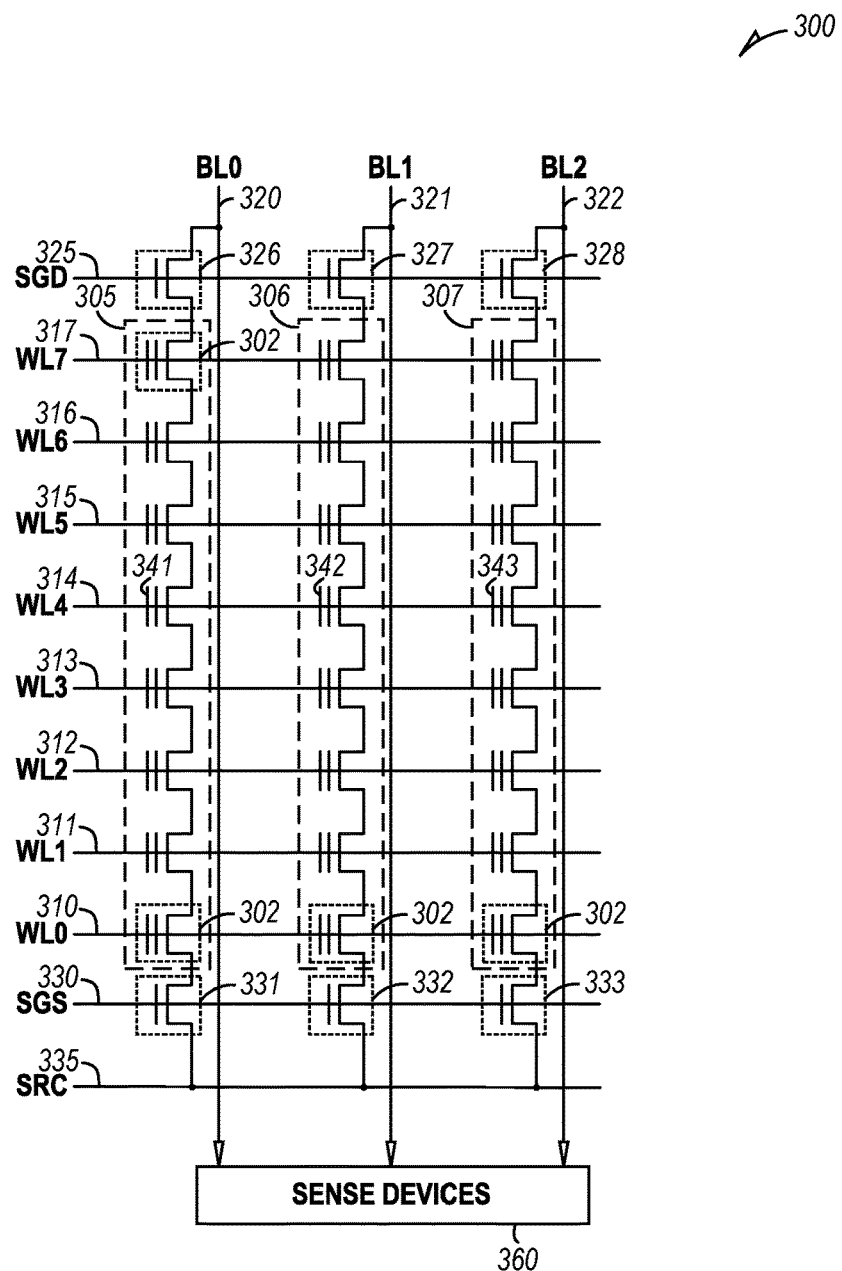

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
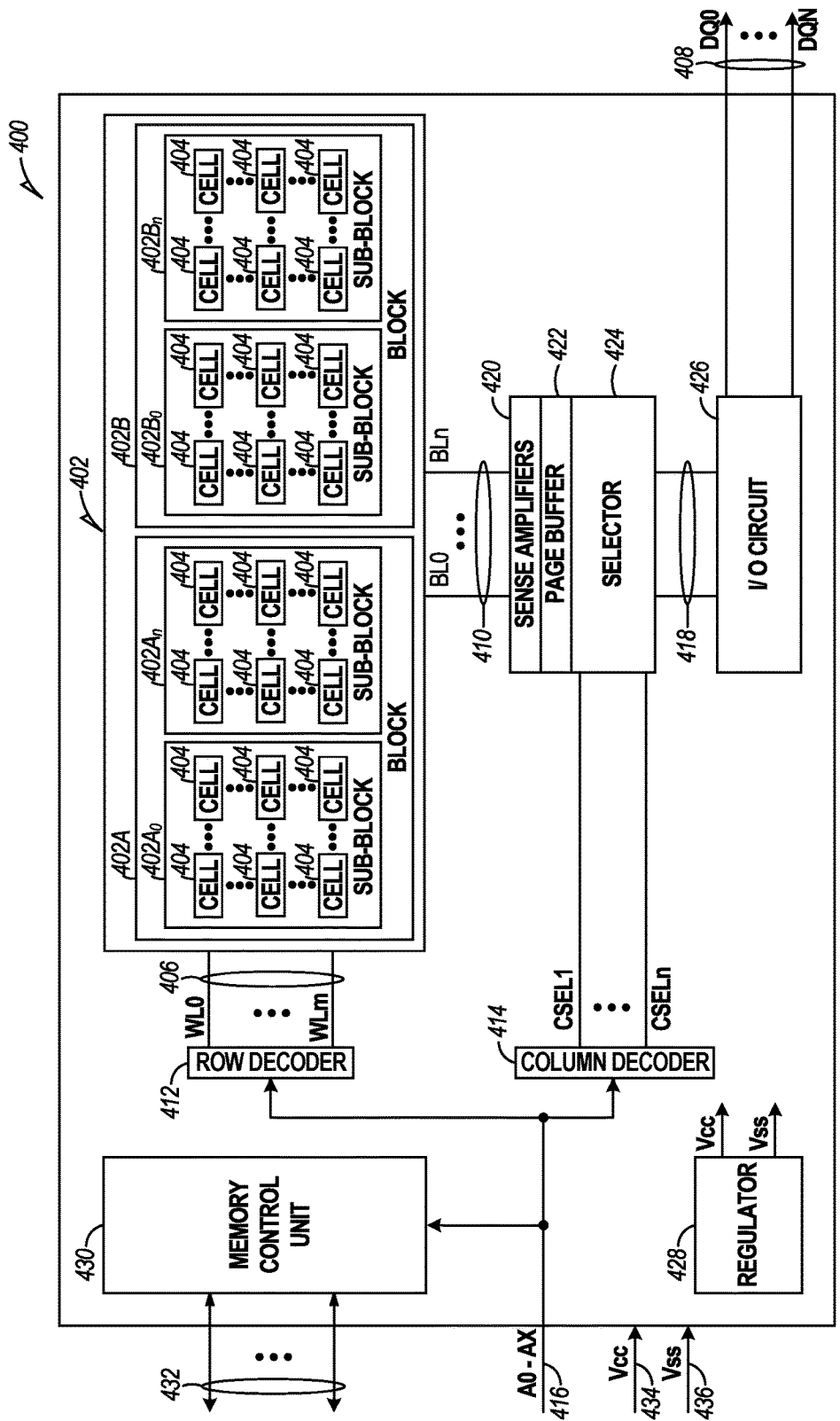
FIG. 4 illustrates an example block diagram of a memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks $402A_0$, $402A_n$, and the second block 402B can include first and second sub-blocks $402B_0$, $402B_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Figure 5:
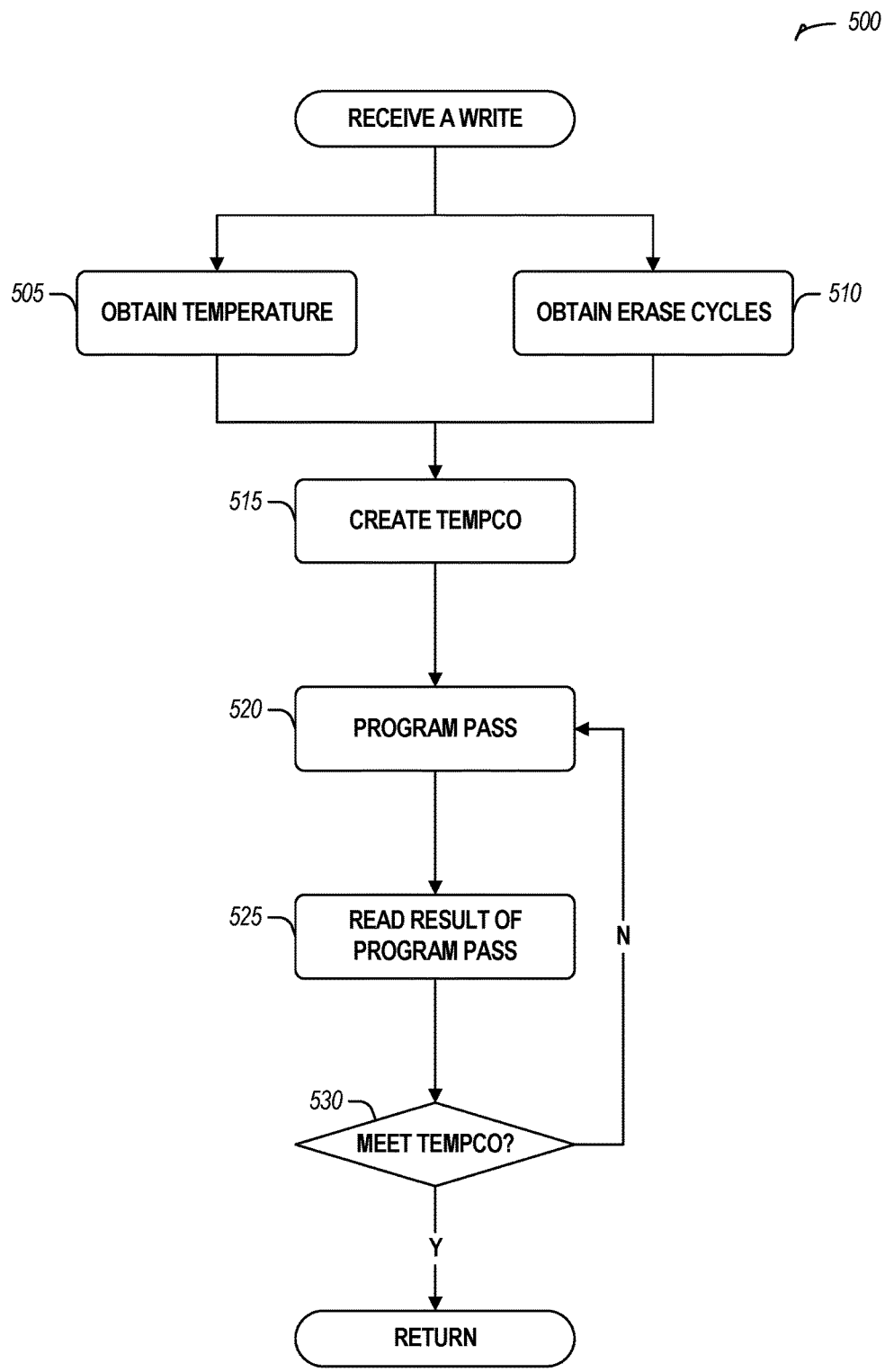
FIG. 5 illustrates a flowchart of an example of a method for programming a cell using a temperature compensation value.

FIG. 5 illustrates a flowchart of an example of a method 500 for programming a cell using a temperature compensation value. The operations of the method 500 are performed by hardware, such as that described above with respect to FIGS. 1-4 and below with respect to FIG. 8 (e.g., processing circuitry). The method 500 begins with receipt of a write request. Typically, the write request will originate from the host (e.g., an application running thereon). Ultimately, the memory device will select some cells to place a portion of the data being written. In preparing to program these cells, the device obtains a current NAND temperature (operation 505) and the number of erase cycles (operation 510). These two values are used to create a temperature compensation value (e.g., tempco). In an example, creating of the temperature compensation value can include applying a to the NAND temperature and the erase cycle values to arrive at the temperature compensation value. In an example, creating of the temperature compensation value can include retrieving the temperature compensation value form a data structure using the NAND temperature and the erase cycles (e.g., as keys).

Once the temperature compensation value is created, it is used to facilitate programming the cell to a target charge distribution. The temperature compensation value is written to trim table (e.g., in a volatile memory of the controller) and used in a programming pass (operation 520). The result of the programming is read (operation 525) and tested (decision 530) to determine whether the charge distribution in the cell has reached a verification level computed from the temperature compensation value written to the trim table. If not, then the programming passes continue. If yes, then the write is complete. Thus, the temperature compensation value is used to calculate the verification level for a given temperature to program data into a cell.

Figure 6:
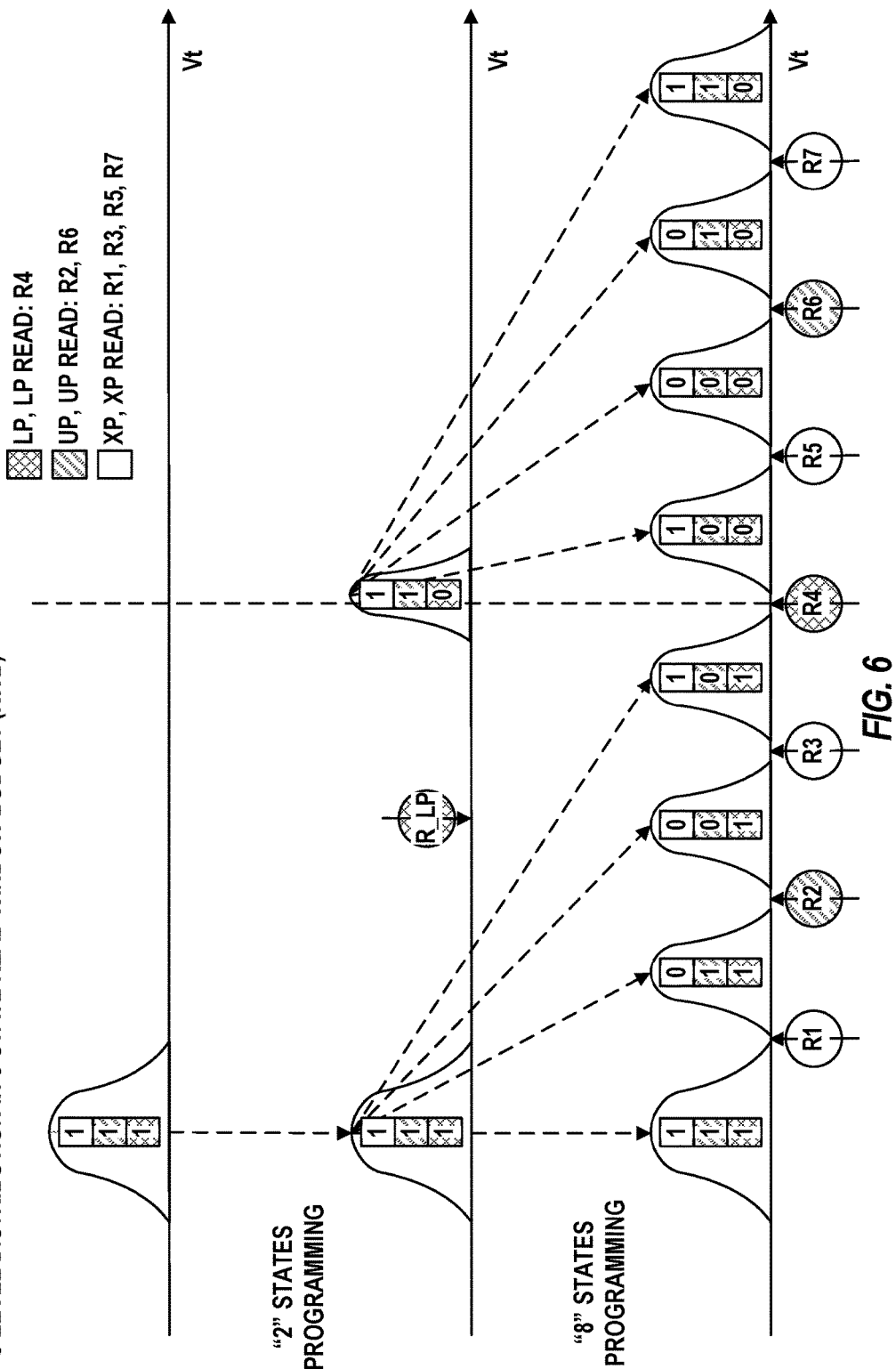
FIG. 6 illustrates voltage distributions for a three-level encoding of a multi-level NAND.

FIG. 6 illustrates voltage distributions for a three-level encoding of a multi-level NAND. The distributions illustrate the eight voltage values corresponding to eight encoding states. The order in which the data is encoded in the multiple programming passes is noted from the top to the bottom and by arrows indicating how voltage is added at each stage of the programming to achieve the subsequent state. The read voltages for the pages are indicated by the shade-coordinated arrows on the bottom line. FIG. 6 represents an unmodified TLC encoding.

Figure 7:
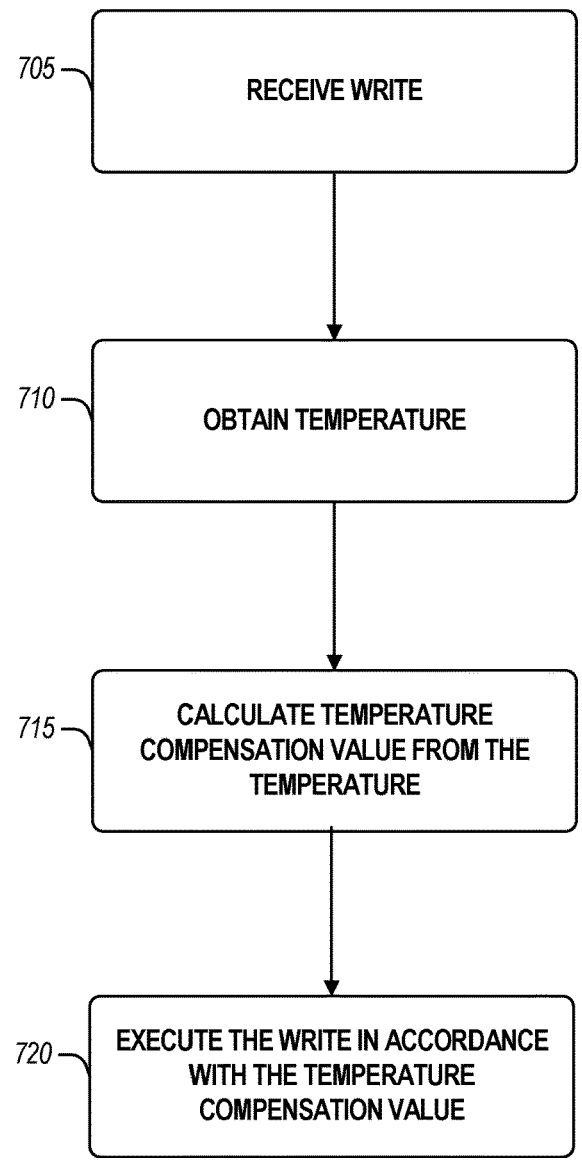
FIG. 7 illustrates a flowchart of an example of a method for temperature sensitive NAND programming.

FIG. 7 illustrates a flowchart of an example of a method 700 for temperature sensitive NAND programming. The operations of the method 700 are performed by hardware, such as that described above or below (e.g., processing circuitry).

At operation 705, a command to write data to a NAND component in a NAND device is received.

At operation 710, a temperature corresponding to the NAND component is obtained in response to receiving the command. In an example, obtaining the temperature includes retrieving the temperature from a thermometer in response to receiving the command. In an example, obtaining the temperature includes retrieving the temperature from a buffer. In this example, the thermometer periodically measures the temperature and stores it in the buffer.

At operation 715, a temperature compensation value is calculated from the temperature. In an example, temperature compensation value is specific to the NAND component. In an example, the NAND component is a page.

In an example, calculating the temperature compensation value from the temperature includes quantifying the temperature into one range of a set temperature ranges, and selecting the temperature compensation value using the one range. In an example, the set of temperature ranges do not overlap. In an example, the set of temperature ranges include the following ranges: <0° C., [0° C., 30° C.), [30° C., 90° C.), and ≥90° C. In an example, selecting the temperature compensation value using the one range includes identifying an intermediate temperature compensation value using the one range, and modifying the intermediate temperature compensation value based on a P/E metric of the NAND component to produce the temperature compensation value. In an example, the P/E metric is a count of program and erase cycles performed on the NAND component. In an example, the count of program and erase cycles is determined by the number of times the NAND component has been erased.

At operation 720, the command to write data to the NAND component is executed in accordance with the temperature compensation value. In an example, executing the command includes writing the temperature compensation value into the trim table. In an example, the trim table stored in a volatile memory of the NAND device.

FIG. 8 illustrates a block diagram of an example machine 800 upon which any one or more of the techniques (e.g., methodologies) discussed herein can perform. In alternative embodiments, the machine 800 can operate as a standalone device or can be connected (e.g., networked) to other machines. In a networked deployment, the machine 800 can operate in the capacity of a server machine, a client machine, or both in server-client network environments. In an example, the machine 800 can act as a peer machine in peer-to-peer (P2P) (or other distributed) network environment. The machine 800 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 800 (e.g., the host device 105, the memory device 110, etc.) can include a hardware processor 802 (e.g., a central processing unit (CPU), a graphics processing unit (GPU), a hardware processor core, or any combination thereof, such as the memory controller 115, etc.), a main memory 804 and a static memory 806, some or all of which can communicate with each other via an interlink (e.g., bus) 808. The machine 800 can further include a display unit 810, an alphanumeric input device 812 (e.g., a keyboard), and a user interface (UI) navigation device 814 (e.g., a mouse). In an example, the display unit 810, input device 812 and UI navigation device 814 can be a touch screen display. The machine 800 can additionally include a storage device (e.g., drive unit) 816, a signal generation device 818 (e.g., a speaker), a network interface device 820, and one or more sensors 816, such as a global positioning system (GPS) sensor, compass, accelerometer, or other sensor. The machine 800 can include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 816 can include a machine readable medium 822 on which is stored one or more sets of data structures or instructions 824 (e.g., software) embodying or utilized by any one or more of the techniques or functions described herein. The instructions 824 can also reside, completely or at least partially, within the main memory 804, within static memory 806, or within the hardware processor 802 during execution thereof by the machine 800. In an example, one or any combination of the hardware processor 802, the main memory 804, the static memory 806, or the storage device 816 can constitute the machine readable medium 822.

While the machine readable medium 822 is illustrated as a single medium, the term "machine readable medium" can include a single medium or multiple media (e.g., a centralized or distributed database, or associated caches and servers) configured to store the one or more instructions 824.

The term "machine readable medium" can include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine readable medium examples can include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 824 (e.g., software, programs, an operating system (OS), etc.) or other data are stored on the storage device 821, can be accessed by the memory 804 for use by the processor 802. The memory 804 (e.g., DRAM) is typically fast, but volatile, and thus a different type of storage than the storage device 821 (e.g., an SSD), which is suitable for long-term storage, including while in an "off" condition. The instructions 824 or data in use by a user or the machine 800 are typically loaded in the memory 804 for use by the processor 802. When the memory 804 is full, virtual space from the storage device 821 can be allocated to supplement the memory 804; however, because the storage 821 device is typically slower than the memory 804, and write speeds are typically at least twice as slow as read speeds, use of virtual memory can greatly reduce user experience due to storage device latency (in contrast to the memory 804, e.g., DRAM). Further, use of the storage device 821 for virtual memory can greatly reduce the usable lifespan of the storage device 821.

In contrast to virtual memory, virtual memory compression (e.g., the Linux® kernel feature "ZRAM") uses part of the memory as compressed block storage to avoid paging to the storage device 821. Paging takes place in the compressed block until it is necessary to write such data to the storage device 821. Virtual memory compression increases the usable size of memory 804, while reducing wear on the storage device 821.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 824 can further be transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 820 can include one or more physical jacks (e.g., Ethernet, coaxial, or phone jacks) or one or more antennas to connect to the communications network 826. In an example, the network interface device 820 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 800, and includes digital or analog communications signals or other intangible medium to facilitate communication of such software.

Additional Examples

Example 1 is a device for temperature sensitive NAND programming, the device comprising: a NAND array that includes a NAND component; volatile memory that includes a temperature compensation value; and a controller to: receive a command to write data to the NAND; obtain a temperature corresponding to the NAND component in response to receipt of the command; calculate a verification level from the temperature compensation value and the temperature; and execute the command to write data to the NAND component in accordance with the verification level.

In Example 2, the subject matter of Example 1, wherein the temperature compensation value is specific to the NAND component.

In Example 3, the subject matter of Example 2, wherein the NAND component is a page.

In Example 4, the subject matter of any of Examples 1-3, wherein, to execute the command to write data to the NAND component in accordance with the verification level, the controller iteratively: programs the NAND component to instill a NAND component value; and checks the NAND component value against the verification level until the NAND component value passes the verification level.

In Example 5, the subject matter of Example 4, wherein the NAND component value passes the verification level when a read level generated according the temperature compensation value results in a successful read of the NAND component value.

In Example 6, the subject matter of any of Examples 1-5, wherein, to obtain the temperature, the controller obtains the temperature from a thermometer in response to receiving the command.

In Example 7, the subject matter of any of Examples 1-6, wherein, to obtain the temperature, the controller obtains the temperature from a buffer, a thermometer periodically measuring the temperature and storing the temperature in the buffer.

In Example 8, the subject matter of any of Examples 1-7, wherein the controller is arranged to calculate the temperature compensation value from the temperature, including: a quantification of the temperature into one range of a set temperature ranges; and a selection of the temperature compensation value using the one range.

In Example 9, the subject matter of Example 8, wherein the set of temperature ranges do not overlap.

In Example 10, the subject matter of Example 9, wherein the set of temperature ranges include the following ranges in degrees Celsius: <0 C, [0 C, 30 C), [30 C, 90 C), and ≥90 C.

In Example 11, the subject matter of any of Examples 8-10, wherein, to select the temperature compensation, the controller: identifies an intermediate temperature compensation value using the one range; and modifies the intermediate temperature compensation value based on a program-erase metric of the NAND component to produce the temperature compensation value.

In Example 12, the subject matter of Example 11, wherein the program-erase metric is a count of program and erase cycles performed on the NAND component.

In Example 13, the subject matter of Example 12, wherein the count of program and erase cycles is determined by a number of times the NAND component has been erased.

Example 14 is a method for temperature sensitive NAND programming, the method comprising: receiving, at a controller of a NAND device, a command to write data to a NAND component in the NAND device; obtaining a temperature corresponding to the NAND component in response to receiving the command; calculating a verification level from a temperature compensation value and the temperature; and executing the command to write data to the NAND component in accordance with the verification level.

In Example 15, the subject matter of Example 14, wherein the temperature compensation value is specific to the NAND component.

In Example 16, the subject matter of Example 15, wherein the NAND component is a page.

In Example 17, the subject matter of any of Examples 14-16, wherein executing the command to write data to the NAND component in accordance with the verification level includes iteratively: programming the NAND component to instill a NAND component value; and checking the NAND component value against the verification level until the NAND component value passes the verification level.

In Example 18, the subject matter of Example 17, wherein the NAND component value passes the verification level when a read level generated according the temperature compensation value results in a successful read of the NAND component value.

In Example 19, the subject matter of any of Examples 14-18, wherein obtaining the temperature includes obtaining the temperature from a thermometer in response to receiving the command.

In Example 20, the subject matter of any of Examples 14-19, wherein obtaining the temperature includes obtaining the temperature from a buffer, a thermometer periodically measuring the temperature and storing the temperature in the buffer.

In Example 21, the subject matter of any of Examples 14-20, comprising calculating the temperature compensation value from the temperature, including: quantifying the temperature into one range of a set temperature ranges; and selecting the temperature compensation value using the one range.

In Example 22, the subject matter of Example 21, wherein the set of temperature ranges do not overlap.

In Example 23, the subject matter of Example 22, wherein the set of temperature ranges include the following ranges in degrees Celsius: <0 C, [0 C, 30 C), [30 C, 90 C), and ≥90 C.

In Example 24, the subject matter of any of Examples 21-23, wherein selecting the temperature compensation value using the one range includes: identifying an intermediate temperature compensation value using the one range; and modifying the intermediate temperature compensation value based on a program-erase metric of the NAND component to produce the temperature compensation value.

In Example 25, the subject matter of Example 24, wherein the program-erase metric is a count of program and erase cycles performed on the NAND component.

In Example 26, the subject matter of Example 25, wherein the count of program and erase cycles is determined by a number of times the NAND component has been erased.

Example 27 is a machine readable medium including instructions for temperature sensitive NAND programming, the instructions, when executed by processing circuitry, cause the processing circuitry to perform operations comprising: receiving, at a controller of a NAND device, a command to write data to a NAND component in the NAND device; obtaining a temperature corresponding to the NAND component in response to receiving the command; calculating a verification level from a temperature compensation value and the temperature; and executing the command to write data to the NAND component in accordance with the verification level.

In Example 28, the subject matter of Example 27, wherein the temperature compensation value is specific to the NAND component.

In Example 29, the subject matter of Example 28, wherein the NAND component is a page.

In Example 30, the subject matter of any of Examples 27-29, wherein executing the command to write data to the NAND component in accordance with the verification level includes iteratively: programming the NAND component to instill a NAND component value; and checking the NAND component value against the verification level until the NAND component value passes the verification level.

In Example 31, the subject matter of Example 30, wherein the NAND component value passes the verification level when a read level generated according the temperature compensation value results in a successful read of the NAND component value.

In Example 32, the subject matter of any of Examples 27-31, wherein obtaining the temperature includes obtaining the temperature from a thermometer in response to receiving the command.

In Example 33, the subject matter of any of Examples 27-32, wherein obtaining the temperature includes obtaining the temperature from a buffer, a thermometer periodically measuring the temperature and storing the temperature in the buffer.

In Example 34, the subject matter of any of Examples 27-33, comprising calculating the temperature compensation value from the temperature, including: quantifying the temperature into one range of a set temperature ranges; and selecting the temperature compensation value using the one range.

In Example 35, the subject matter of Example 34, wherein the set of temperature ranges do not overlap.

In Example 36, the subject matter of Example 35, wherein the set of temperature ranges include the following ranges in degrees Celsius: <0 C, [0 C, 30 C), [30 C, 90 C), and ≥90 C.

In Example 37, the subject matter of any of Examples 34-36, wherein selecting the temperature compensation value using the one range includes: identifying an intermediate temperature compensation value using the one range; and modifying the intermediate temperature compensation value based on a program-erase metric of the NAND component to produce the temperature compensation value.

In Example 38, the subject matter of Example 37, wherein the program-erase metric is a count of program and erase cycles performed on the NAND component.

In Example 39, the subject matter of Example 38, wherein the count of program and erase cycles is determined by a number of times the NAND component has been erased.

Example 40 is a system for temperature sensitive NAND programming, the system comprising: means for receiving, at a controller of a NAND device, a command to write data to a NAND component in the NAND device; means for obtaining a temperature corresponding to the NAND component in response to receiving the command; means for calculating a verification level from a temperature compensation value and the temperature; and means for executing the command to write data to the NAND component in accordance with the verification level.

In Example 41, the subject matter of Example 40, wherein the temperature compensation value is specific to the NAND component.

In Example 42, the subject matter of Example 41, wherein the NAND component is a page.

In Example 43, the subject matter of any of Examples 40-42, wherein the means for executing the command to write data to the NAND component in accordance with the verification level include means for iteratively: programming the NAND component to instill a NAND component value; and checking the NAND component value against the verification level until the NAND component value passes the verification level.

In Example 44, the subject matter of Example 43, wherein the NAND component value passes the verification level when a read level generated according the temperature compensation value results in a successful read of the NAND component value.

In Example 45, the subject matter of any of Examples 40-44, wherein the means for obtaining the temperature include means for obtaining the temperature from a thermometer in response to receiving the command.

In Example 46, the subject matter of any of Examples 40-45, wherein the means for obtaining the temperature include means for obtaining the temperature from a buffer, a thermometer periodically measuring the temperature and storing the temperature in the buffer.

In Example 47, the subject matter of any of Examples 40-46, comprising means for calculating the temperature compensation value from the temperature, including: means for quantifying the temperature into one range of a set temperature ranges; and means for selecting the temperature compensation value using the one range.

In Example 48, the subject matter of Example 47, wherein the set of temperature ranges do not overlap.

In Example 49, the subject matter of Example 48, wherein the set of temperature ranges include the following ranges in degrees Celsius: <0 C, [0 C, 30 C), [30 C, 90 C), and ≥90 C.

In Example 50, the subject matter of any of Examples 47-49, wherein the means for selecting the temperature compensation value using the one range include: means for identifying an intermediate temperature compensation value using the one range; and means for modifying the intermediate temperature compensation value based on a program-erase metric of the NAND component to produce the temperature compensation value.

In Example 51, the subject matter of Example 50, wherein the program-erase metric is a count of program and erase cycles performed on the NAND component.

In Example 52, the subject matter of Example 51, wherein the count of program and erase cycles is determined by a number of times the NAND component has been erased.

Example 53 is at least one machine-readable medium including instructions that, when executed by processing circuitry, cause the processing circuitry to perform operations to implement of any of Examples 1-52.

Example 54 is an apparatus comprising means to implement of any of Examples 1-52.

Example 55 is a system to implement of any of Examples 1-52.

Example 56 is a method to implement of any of Examples 1-52.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device can be configured to provide wear cycle information to the memory device with each memory operation. The memory device control circuitry (e.g., control logic) can be programmed to compensate for memory device performance changes corresponding to the wear cycle information. The memory device can receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements can be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A device for temperature sensitive NAND programming, the device comprising:
   a NAND array that includes a NAND component;
   volatile memory that includes a temperature compensation value; and
   a controller configured to:
   receive a command to write data to the NAND;
   obtain a temperature corresponding to the NAND component in response to receipt of the command;
   calculate a verification level from the temperature compensation value and the temperature; and
   execute the command to write data to the NAND component in accordance with the verification level, wherein, to execute the command to write data to the NAND component in accordance with the verification level, the controller is configured to iteratively:
   program the NAND component to instill a NAND component value; and
   check the NAND component value against the verification level until the NAND component value passes the verification level, wherein the NAND component value passes the verification level when a read level generated according to the temperature compensation value results in a successful read of the NAND component value.

2. The device of claim 1, wherein the temperature compensation value is specific to the NAND component.

3. The device of claim 1, wherein the controller is configured to calculate the temperature compensation value from the temperature, including:
   a quantification of the temperature into one range of a set of temperature ranges; and
   a selection of the temperature compensation value using the one range.

4. The device of claim 3, wherein, to select the temperature compensation, the controller is configured to:
   identify an intermediate temperature compensation value using the one range; and
   modify the intermediate temperature compensation value based on a program-erase metric of the NAND component to produce the temperature compensation value.

5. The device of claim 4, wherein the program-erase metric is a count of program and erase cycles performed on the NAND component.

6. A method for temperature sensitive NAND programming, the method comprising:
   receiving, at a controller of a NAND device, a command to write data to a NAND component in the NAND device;
   obtaining a temperature corresponding to the NAND component in response to receiving the command;
   calculating a verification level from a temperature compensation value and the temperature; and
   executing the command to write data to the NAND component in accordance with the verification level, wherein executing the command to write data to the NAND component in accordance with the verification level includes iteratively:
      programming the NAND component to instill a NAND component value; and
      checking the NAND component value against the verification level until the NAND component value passes the verification level, wherein the NAND component value passes the verification level when a read level generated according to the temperature compensation value results in a successful read of the NAND component value.

7. The method of claim 6, wherein the temperature compensation value is specific to the NAND component.

8. The method of claim 6, comprising calculating the temperature compensation value from the temperature, including:
   quantifying the temperature into one range of a set of temperature ranges; and
   selecting the temperature compensation value using the one range.

9. The method of claim 8, wherein selecting the temperature compensation value using the one range includes:
   identifying an intermediate temperature compensation value using the one range; and
   modifying the intermediate temperature compensation value based on a program-eras metric of the NAND component to produce the temperature compensation value.

10. The method of claim 9, wherein the program-erase metric is a count of program and erase cycles performed on the NAND component.

11. A non-transitory machine readable medium including instructions for temperature sensitive NAND programming, the instructions, when executed by processing circuitry, cause the processing circuitry to perform operations comprising:
   receiving, at a controller of a NAND device, a command to write data to a NAND component in the NAND device;
   obtaining a temperature corresponding to the NAND component in response to receiving the command;
   calculating a verification level from a temperature compensation value and the temperature; and
   executing the command to write data to the NAND component in accordance with the verification level, wherein executing the command to write data to the NAND component in accordance with the verification level includes iteratively:
      programming the NAND component to instill a NAND component value; and
      checking the NAND component value against the verification level until the NAND component value passes the verification level, wherein the NAND component value passes the verification level when a read level generated according to the temperature compensation value results in a successful read of the NAND component value.

12. The machine readable medium of claim 11, wherein the temperature compensation value is specific to the NAND component.

13. The machine readable medium of claim 11, comprising calculating the temperature compensation value from the temperature, including:
   quantifying the temperature into one range of a set of temperature ranges; and
   selecting the temperature compensation value using the one range.

14. The machine readable medium of claim 13, wherein selecting the temperature compensation value using the one range includes:
   identifying an intermediate temperature compensation value using the one range; and
   modifying the intermediate temperature compensation value based on a program-erase metric of the NAND component to produce the temperature compensation value.

15. The machine readable medium of claim 14, wherein the program-erase metric is a count of program and erase cycles performed on the NAND component.

* * * * *